United States Patent
Horng et al.

(10) Patent No.: US 9,354,124 B2
(45) Date of Patent: May 31, 2016

(54) TEMPERATURE/VOLTAGE DETECTION CIRCUIT

(71) Applicant: TAIWAN SEMICONDUCTOR MANUFACTURING COMPANY, LTD., Hsinchu (TW)

(72) Inventors: Jaw-Juinn Horng, Hsinchu (TW); Szu-Lin Liu, Hsinchu (TW); Chung-Hui Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/193,563

(22) Filed: Feb. 28, 2014

(65) Prior Publication Data

US 2014/0368264 A1      Dec. 18, 2014

Related U.S. Application Data

(63) Continuation-in-part of application No. 13/919,274, filed on Jun. 17, 2013.

(51) Int. Cl.
*H03K 5/153*      (2006.01)
*G01K 7/01*       (2006.01)
*G01R 19/00*      (2006.01)

(52) U.S. Cl.
CPC .............. *G01K 7/01* (2013.01); *G01R 19/0084* (2013.01)

(58) Field of Classification Search
CPC ....... H03K 5/2481; H03K 5/249; H03K 5/08; H03K 5/24; G01R 19/16519
USPC .............................. 327/74–76, 131, 512–513
See application file for complete search history.

(56) References Cited

U.S. PATENT DOCUMENTS

| 7,863,992 | B2 * | 1/2011 | Chung ........................ 331/111 |
| 8,618,848 | B1 * | 12/2013 | Chee ............................ 327/131 |
| 2003/0160641 | A1 * | 8/2003 | Starr et al. .................. 327/156 |
| 2005/0001595 | A1 * | 1/2005 | May et al. .................... 320/140 |
| 2012/0068641 | A1 * | 3/2012 | Imura ...................... 318/400.02 |

FOREIGN PATENT DOCUMENTS

JP        2010156621 A   *   7/2010

* cited by examiner

*Primary Examiner* — Quan Tra
(74) *Attorney, Agent, or Firm* — Hauptman Ham, LLP

(57) ABSTRACT

A circuit includes a comparator unit, a capacitive device, and a switching network. The comparator unit is configured to set a control signal at a first logical value when an output voltage reaches a first voltage value from being less than the first voltage value, and to set the control signal at a second logical value when the output voltage reaches a second voltage value from being greater than the second voltage. The capacitive device provides the output voltage. The switching network is configured to charge or discharge the capacitive device based on the control signal.

20 Claims, 10 Drawing Sheets

TEMPERATURE/VOLTAGE DETECTION CIRCUIT

CROSS-REFERENCES TO RELATED APPLICATIONS

The present application is a continuation-in-part of U.S. patent application Ser. No. 13/919,274, filed Jun. 17, 2013, which is hereby incorporated by reference for all purposes.

FIELD

The present disclosure is related to a temperature detection circuit and/or a voltage detection circuit.

BACKGROUND

In some applications, a voltage difference between two nodes of a circuit is usable for measuring a temperature or a voltage level of a power supply.

For measuring a temperature, many thermal sensors have deficiencies. For example, in an approach, a bipolar transistor (BJT) is used as part of a sensor. The BJT has a voltage Vbe drop across a base and an emitter of the BJT. By operation of the BJT, voltage Vbe varies as temperature varies. Further, the temperature coefficient of the sensor is not linear. As a result, temperature variations with respect to Vbe changes cannot be measured with high accuracy.

In another approach, two BJTs are used in two branches of the sensor. In some applications, additional circuitry is used in conjunction with the sensor. Exemplary additional circuitry includes a temperature independent current source and a "chop" circuitry. The chop circuitry is used to cancel noise and current mismatch. The additional circuitry adds complexity to the sensor.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
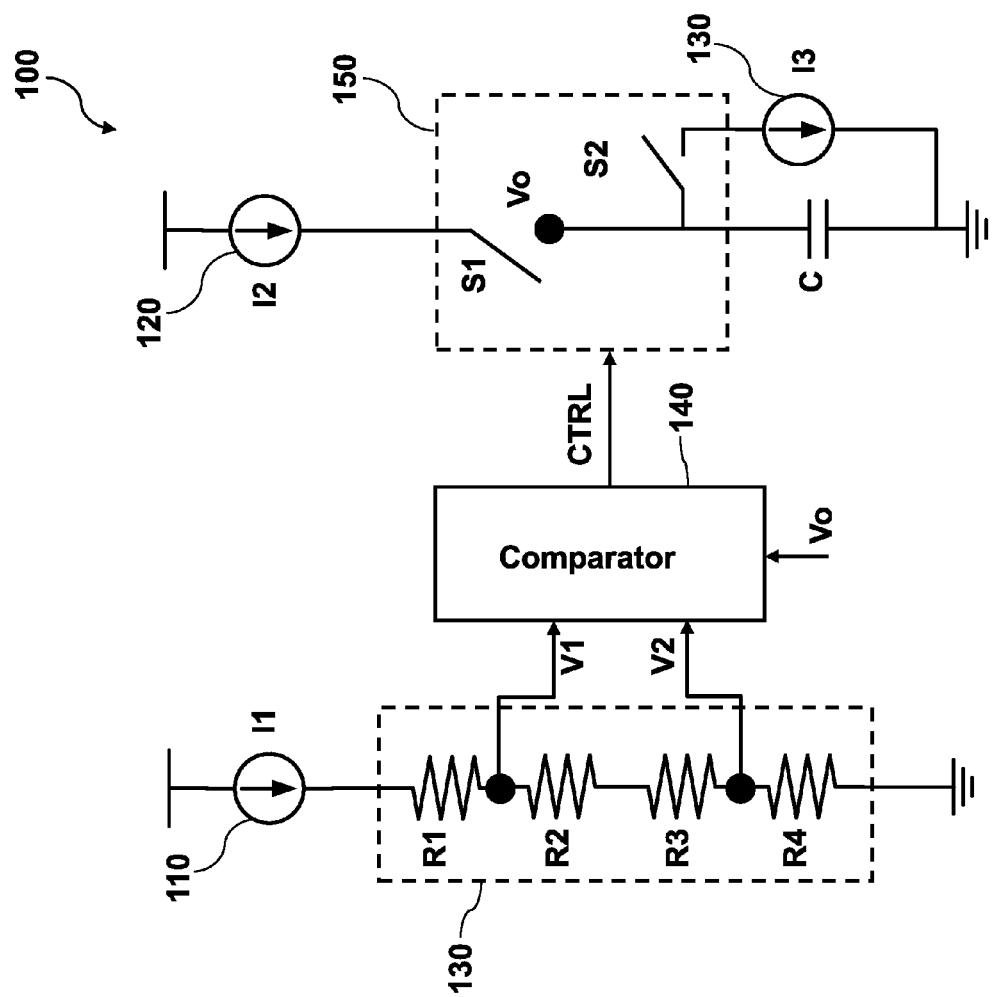
FIG. 1 is a diagram of a circuit for use in a thermal sensor, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, two voltages are generated based on resistive components and a single current. When the temperature on a device changes, for example, the changed temperature is measured based on the two voltages. Because the two voltages are generated based on a single current, temperature variation of the current on one voltage is canceled by temperature variation of the current on the other voltage. As a result, temperature measurements based on the two voltages provide increased accuracy. In some embodiments, temperature variations of various devices with respect to time are measured based on the two voltages.

Temperature Sensor

FIG. 1 is a diagram of a circuit 100, in accordance with some embodiments. In some embodiments, circuit 100 is used in a temperature sensor.

Voltages V1 and V2 are generated based on a current source 110 providing a current I1 flowing through a resistor branch 130. For illustration, resistor branch 130 includes four resistors R1, R2, R3, and R4 that are coupled in series. Resistors R1, R2, R3, and R4 function as a voltage divider. In some embodiments, each of resistors R1, R2, R3, and R4 has a same resistance value as that of another resistor. As a result, V1=3*V2. For illustration, a ratio of voltage V1 over voltage V2 is called RAT. In the example of FIG. 1, RAT=V1/V2=3.

Resistor branch 130 is used for illustration. Other resistance values for each of resistors R1, R2, R3, or R4 and/or other configurations of resistor branch 130 are within the contemplated scope of the present disclosure. In some embodiments, a relationship between voltage V1 and voltage V2 is first determined. A value for each of resistors R1, R2, R3, and R4 is then selected to satisfy the relationship between voltages V1 and V2. In some embodiments, the relationship between voltages V1 and V2 is expressed in term of ratio RAT. For illustration, the relationship between voltages V1 and V2 based on a value of ratio RAT, such as 3, is predetermined. Each value of each of resistors R1, R2, R3, and R4 is then selected to provide ratio RAT having the value 3. Different types of resistors used in resistor branch 130 are explained with reference to FIG. 3.

A comparator unit labeled as comparator 140 receives an input voltage V1, and input voltage V2, and an output voltage Vo to generate a control signal CTRL used to control a switching network 150 that includes switches S1 and S2. For example, in a charging mode, voltage Vo increases, and comparator 140 compares voltage V1 and voltage Vo. When voltage Vo reaches voltage V1, comparator 140 generates signal CTRL to open switch S1 and close switch S2 to turn into a discharging mode. In contrast, in a discharging mode, voltage Vo decreases, and comparator 140 compares voltage V2 and voltage Vo. When voltage Vo reaches voltage V2, comparator 140 generates signal CTRL to open switch S2 and close switch S1 to turn into the charging mode. Effectively, when switch S1 is closed and switch S2 is open, capacitor C is charged and voltage Vo increases. In some embodiments, comparator 140 provides a high logical value to control signal CTRL to open switch S1 and to close switch S2. In contrast, when switch S1 is open and switch S2 is closed, capacitor C is discharged, and voltage Vo decreases. In some embodiments, comparator 140 provides a low logical value to control signal CTRL to close switch S1 and to open switch S2. Other values of control signal CTRL to control switches S1 and S2 are within the contemplated scope of the present disclosure.

Switches S1 and S2 form switching network 150 and function for voltage Vo at an end of a capacitor C to charge and discharge capacitor C. Effectively, voltage Vo varies responsive to such charging and discharging of capacitor C. For example, in some embodiments, when switch S1 is closed and switch S2 is open, voltage Vo is charged by capacitor C and current I2 of a current source 120. In contrast, when switch S1 is open and switch S2 is closed, voltage Vo is discharged by capacitor C and a current I3 of a current source 130. Current I3 flows in parallel with capacitor C. In some embodiments, each of currents I1, I2, and I3 has a same value as that of the other currents. Configuration of switching network 150 is shown for illustration. Other configurations of switching network 150 to charge and discharge voltage Vo are within the contemplated scope of the present disclosure. In some embodiments, capacitor C has a capacitance value determined based on a timing characteristic of a circuit that uses circuit 100.

Waveforms

Figure 2:
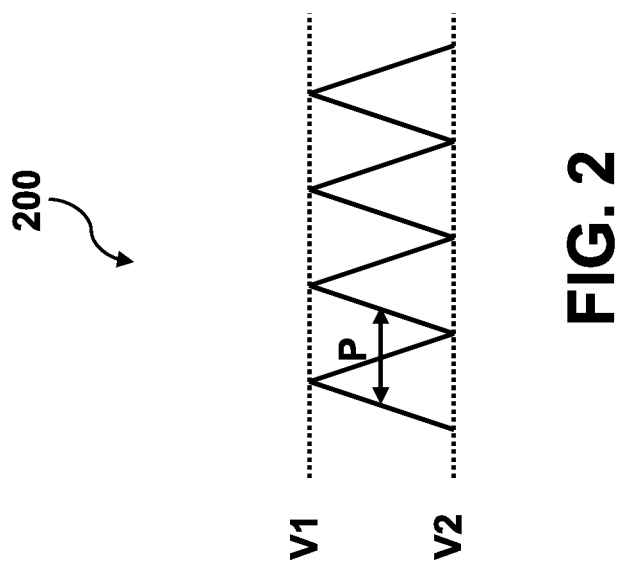
FIG. 2 is a graph of a waveform of the output voltage of the circuit in FIG. 1, in accordance with some embodiments.

FIG. 2 is a graph of a waveform 200 in accordance with some embodiments. Waveform 200 represents behavior of voltage Vo in FIG. 1 with reference to voltages V1 and V2 over time.

By operations of switches S1, S2, control signal CTRL, current I2, capacitor C and current I3, voltage Vo increases and decreases between voltage V1 and voltage V2 as shown in FIG. 2. For example, when voltage Vo is in a charging mode, voltage Vo increases. When voltage Vo reaches voltage V1, switch S1 is open and switch S2 is closed. As a result, voltage Vo changes to a discharging mode. Voltage Vo therefore decreases. When voltage Vo reaches voltage V2, switch S1 is closed and switch S2 is open. As a result, voltage Vo changes to the charging mode. Voltage Vo therefore increases. Over time, voltage Vo continues to increase in the charging mode and decrease in the discharging mode as illustrated by waveform 200.

Temperature Sensing

For illustration, P represents a time duration, a time period, or a time cycle of voltage Vo. In some embodiments, at a particular temperature T, time duration P has a particular value. As a result, when temperature T changes, time duration P changes to a corresponding value. For example, a temperature T1 corresponds to a time duration P1, and a temperature T2 corresponds to a time duration P2. When temperature changes from T1 to T2, the corresponding time duration changes from P1 to P2. In some embodiments, a plurality of time periods P corresponding to a plurality of temperatures T is obtained to generate a relationship between temperature T and time duration P. When a time duration P is known, a corresponding temperature T is determined based on the generated relationship. The relationship based on a plurality of time periods P corresponding to a plurality of temperatures T is called a multi-point calibration system.

In some embodiments, in a single point calibration having a pair of data points T1 and P1, when a time period P2, for example, is achieved based on waveform 200, a corresponding temperature T2 is determined based on a SPICE simulation. In other words, temperature T2 is sensed or measured. Explained in a different way, a variation of temperature from T1 to T2 is monitored and/or measured.

Features

For illustration, each of resistors R1, R2, R3, and R4 in FIG. 1 has a resistance value R. A voltage difference between voltage V1 and voltage V2 is called d(V1–V2). A change in voltage Vo is called d(Vo). A change in time corresponding to a first temperature T1 changing to a second temperature T2 is called dt. Effectively, dt is a change in time duration P1 to time duration P2. In some embodiments, d(V1–V2) is proportional to restive values of resistors R1, R2, R3, and R4, which changes when temperature changes. In other words, a plurality of restive values of each of resistors R1, R2, R3, and R4 is a function of temperature.

Mathematically expressed:

$V1-V2=Vo$ or $d(V1-V2)=d(Vo)$ or $d(V1-V2)/dt=d(Vo)/dt$

Further, $V1=3R*I$ $V2=R*I$

As a result, $V1-V2=2R*I$ and $d(2R*I)/dt=I/C$ or $$d(V1-V2)=d(Vo)=dt/C \qquad (1)$$

Based on the above equation (1), a change in voltage Vo depends on a change of time and a capacitive value of capacitor C, without depending on the changes due to temperature of resistors R1, R2, R3, and R4 that are used in generating voltages V1 and V2. Explained in a different way, each of voltages V1 or V2 is dependent on a single current I1. As a result, variation of current I1 due to temperature on voltage V1 is canceled by variation of current I1 due to temperature on voltage V2. Further, in some embodiments, variation of voltage V1 due to power ripple is canceled by variation of voltage V2 due to power ripple.

Applications in FinFET

Figure 3:
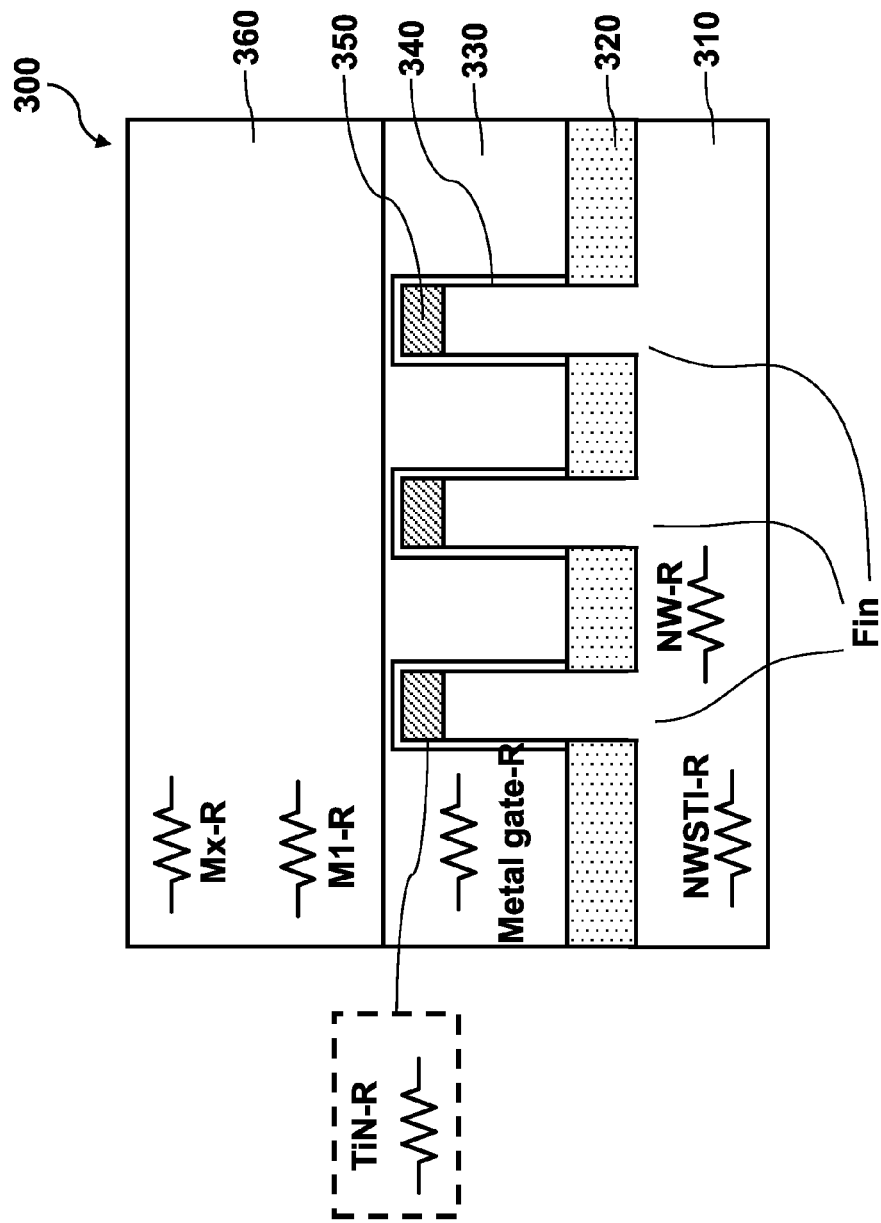
FIG. 3 is a cross-section diagram of a FinFET structure having a plurality of resistors for use in the circuit of claim 1, in accordance with some embodiments.

FIG. 3 is a cross-section view of a FinFET structure 300, in accordance with some embodiments. FinFET structure 300 includes different types of resistors that can be used in place of resistor R1, R2, R3, or R4 in circuit 100 of FIG. 1.

Structure 300 includes a plurality of layers. Each layer includes at least one type of resistors. For simplicity, one resistor of one type is shown in each layer. For example, a substrate 310 includes a first type resistor NWSTI-R and a second type resistor NW-R. For simplicity, one resistor NWSTI-R and one resistor NW-R are shown. Resistor NWSTI is formed between an N-well and a shallow trench isolation (STI). Resistor NW-R is formed in the N-well. For illustration, substrate 310 includes three fins. Substrate 310 having a different number of fins is within the contemplated scope of the present disclosure.

A shallow trench isolation layer 320 is over substrate 310.

A metal gate layer 330 is shown to include a metal gate resistor Metal gate-R.

A dielectric layer 340 includes dielectric resistors. In some embodiments, dielectric layer 340 includes Titanium Nitride (TiN). In some embodiments, resistors in dielectric layer are called resistors TiN-R. In the drawing, because dielectric layer 340 is too small to draw resistor TiN-R inside dielectric layer 340, a resistor TiN-R is shown outside of dielectric layer 340.

A silicon nitride (SiN) layer 350 is over the fins of substrate 310.

An interlayer dielectric layer (IDL) 360 includes a plurality of metal layer including metal layers M1 to Mx (not labeled), for example. Each metal layer includes a type of metal resistors. For example, metal layer M1 includes a plurality of metal resistors M1-R while metal layer Mx includes a plurality of metal resistors Mx-R.

In some embodiments, a diffusion area is on a diffusion layer that is called an OD layer. A layer used to couple diffusion areas and a contact in a metal layer, such as M0 layer, is called an M0OD layer (not shown). In some embodiments, M0OD layer includes resistors M0OD-R (not shown).

FinFET structure 300 is used for illustration. Other structures including corresponding resistors are within the contemplated scope of the present disclosure. For example, a planar semiconductor structure is within the contemplated scope of the present disclosure. For a further example, each layer of the planar structure includes a corresponding type of resistor.

Voltage Difference Detection Circuit

Figure 4A:
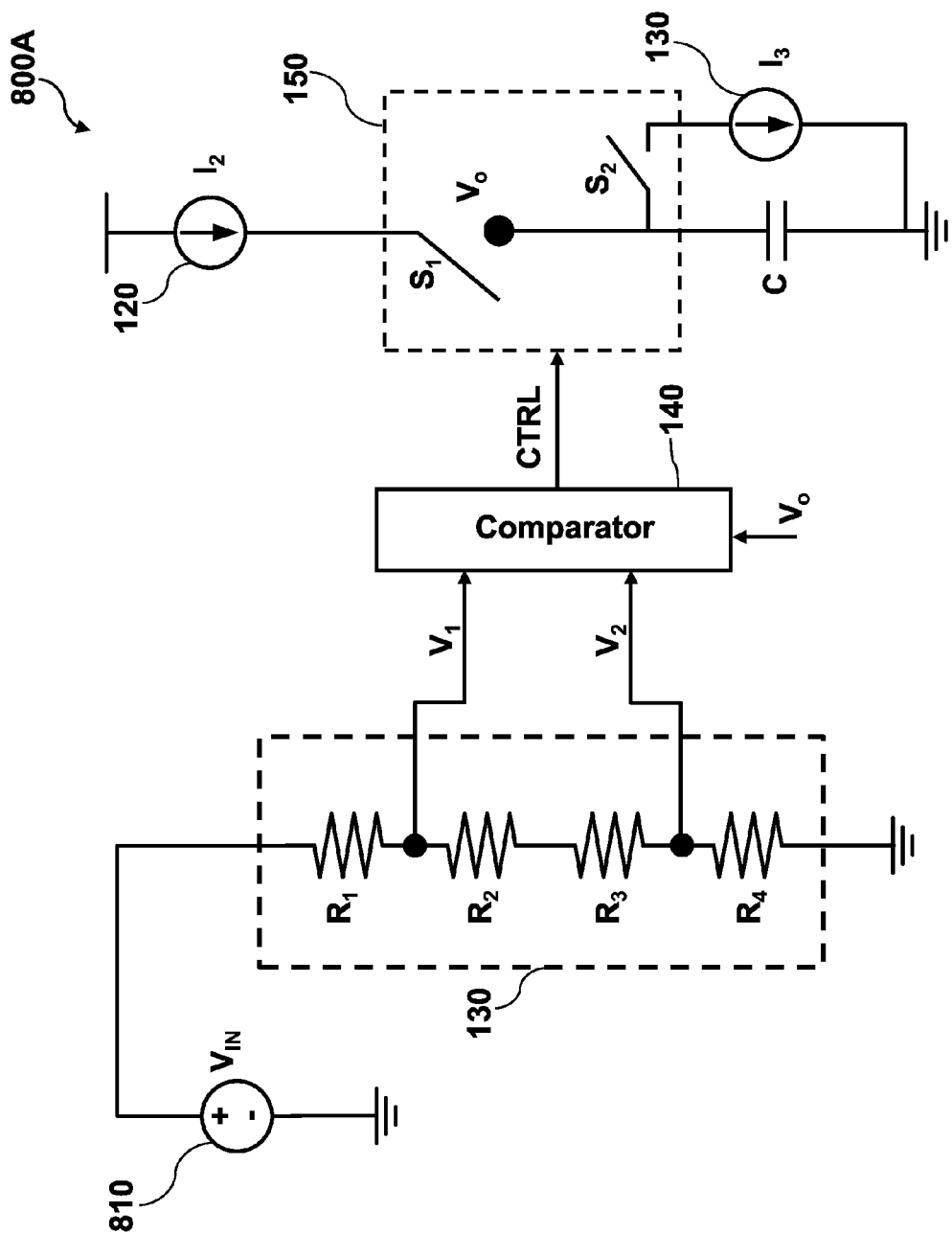
FIGS. 4A and 4B are diagrams of voltage difference detection circuits, in accordance with some embodiments.

FIG. 4A is a diagram of a voltage difference detection circuit 800A, in accordance with some embodiments. Components of circuit 800A that are similar to or the same as those of circuit 100 in FIG. 1 are given the same reference numbers, and a detailed description thereof is omitted.

Compared with circuit 100 in FIG. 1, resistor R1 in circuit 800A has an end coupled to resistor R2 and another end coupled to a voltage source 810. Voltage source 810 outputs a voltage level $V_{IN}$. Resistance values of resistors R1, R2, R3, and R4 are set to allow voltage V1 and V2 falling within an input operation range of comparator 140. In some embodiments, resistors R1, R2, R3, and R4 of resistor branch 130 constitute a voltage divider. Assuming resistance values of resistors R1, R2, R3, and R4 are also denoted as R1, R2, R3, and R4, respectively, various values are mathematically expressed as follows:

$$V1=V_{IN}(R2+R3+R4)/(R1+R2+R3+R4);$$

$$V2=V_{IN}(R4)/(R1+R2+R3+R4); \text{ and}$$

$$(V1-V2)=V_{IN}(R2+R3)/(R1+R2+R3+R4).$$

Therefore, a voltage level of voltage $V_{IN}$ is proportional to a voltage difference between voltage V1 and voltage V2.

In some embodiments, resistor branch 130 includes more or less than four (4) resistors. For example, in some embodiments, resistor branch 130 has N resistors, N is a positive integer. The N resistors and their corresponding resistance values are represented by R[1] to R[N]. In some embodiments, resistor R1 in FIG. 4A corresponds to resistor(s) R[1] to R[M−1], resistor R2 and R3 correspond to resistor(s) R[M] to R[K], and resistor R4 corresponds to resistor(s) R[K+1] to R[N], where 1<M<K<N. Therefore, various values are also expressed as follows:

$$V1=V_{IN}(R[M]+R[M+1]+\ldots+R[N])/(R[1]+R[2]+\ldots+R[N]);$$

$$V2=V_{IN}(R[K+1]+R[K+2]+\ldots+R[N])/(R[1]+R[2]+\ldots+R[N]); \text{ and}$$

$$(V1-V2)=V_{IN}(R[M]+R[M+1]+\ldots+R[K])/(R[1]+R[2]+\ldots+R[N]).$$

Further, the voltage difference between voltage V1 and voltage V2 is measurable by measuring a charging period of switches S1 and S2 in a manner similar to that illustrated in conjunction with FIGS. 1 and 2. In other words, in some embodiments, circuit 100 is modified to become circuit 800A to measure a voltage level $V_{IN}$ of a voltage source 810. In some embodiments, resistance values of resistors R1, R2, R3, and R4 are set to allow detecting a voltage level $V_{IN}$ that is greater than an operation voltage of comparator 140.

Figure 4B:
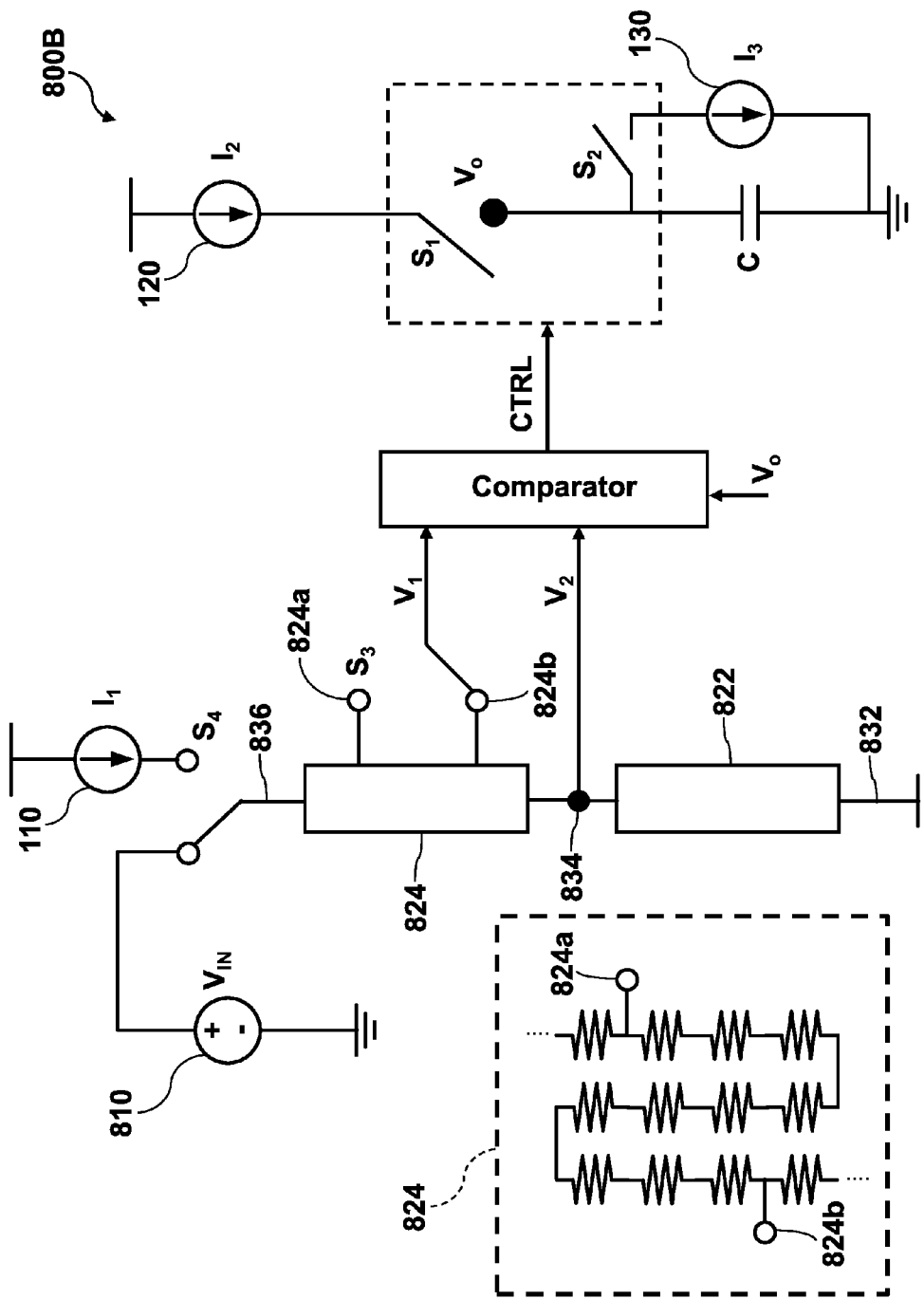

FIG. 4B is a diagram of another voltage difference detection circuit 800B, in accordance with some embodiments. Circuit 800B combines functions of circuit 100 and circuit 800A. Components of circuit 800B that are similar to or the same as those of circuit 100 in FIG. 1 and/or those of circuit 800A in FIG. 4A are given the same reference numbers, and a detailed description thereof is omitted.

Compared with circuit 100 in FIG. 1 and circuit 800A in FIG. 4A, circuit 800B further includes switches S3 and S4. Also, resistors R1, R2, R3, and R4 in circuit 100 and 800A are replaced by resistive devices 822 and 824. Resistive device 822 is between node 832 and node 834. Node 832 carries a reference voltage level that is referred to as 0 voltage level of circuit 800B. Node 834 has voltage V2. Resistive device 824 is between node 834 and node 836. Resistive device 824 has two output nodes 824a and 824b which each divide resistive device 824 into two corresponding segments. In some embodiments, resistive devices 822 and 824 constitute a voltage divider. In FIG. 4B, resistive device 824 includes a plurality of resistors connected in series, and each of node 834 and node 836 correspond to one of the nodes adjoining two corresponding resistors of the plurality of resistors.

Output node 824a is configured according to a first predetermined ratio RAT for performing a temperature measurement operation using circuit 800B and to provide voltage V1 through switch S3. Output node 824b is configured according to a second predetermined ratio RAT for performing a voltage detection operation using circuit 800B and to provide voltage V1 through switch S3. Switch S4 is coupled with node 836. When circuit 800B is set to perform a temperature measurement operation, switch S4 is set to electrically couple node 836 with current source 110. When circuit 800B is set to perform a voltage detection operation, switch S4 is set to electrically couple node 836 with voltage source 810. In some embodiments, switches S3 and S3 are controlled based on a common mode selection signal.

Applications

Figure 5A:
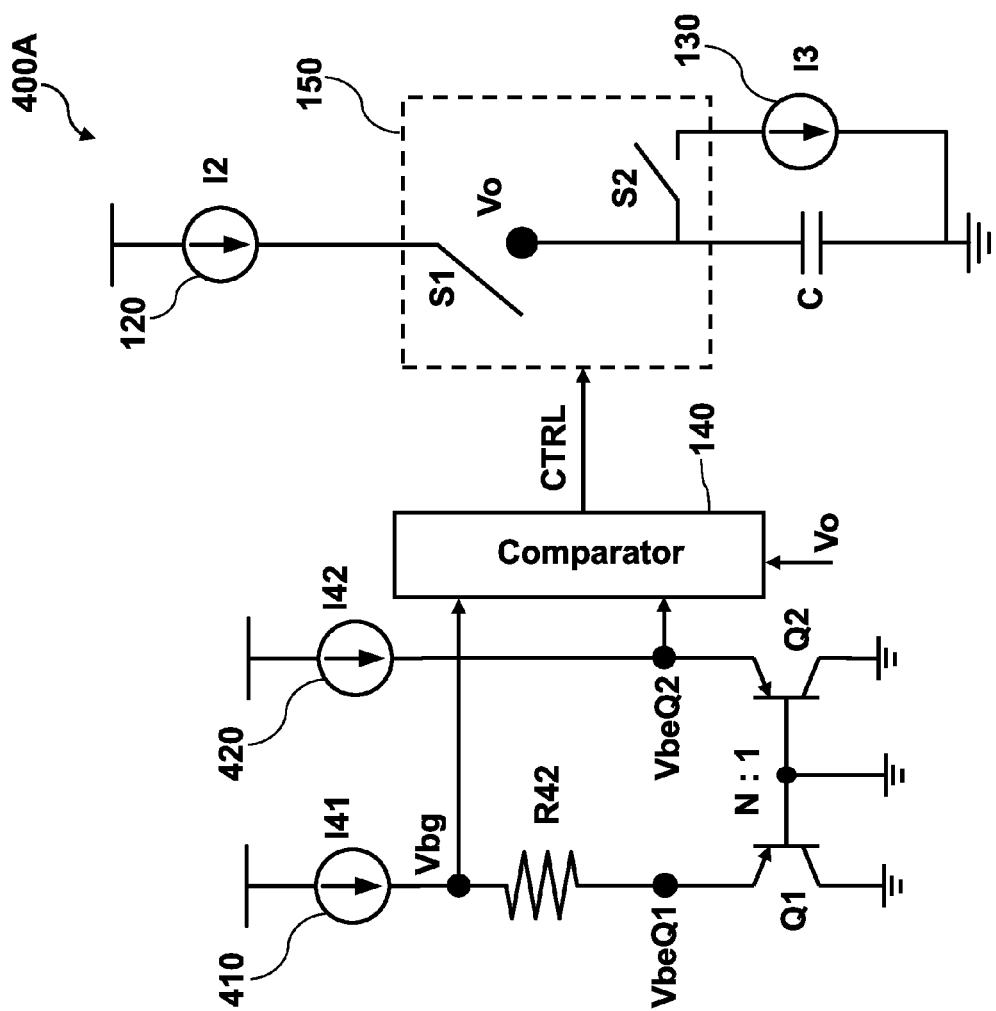
FIGS. 5A, 5B, 6A, and 6B are diagrams of other circuits for use in a thermal sensor, in accordance with some embodiments.

FIG. 5A is a diagram of a circuit 400A, in accordance with some embodiments. In some embodiments, circuit 400A is used in a temperature sensor in a manner similar to circuit 100.

For illustration, a voltage VbeQ1 is a voltage drop across a base and an emitter of a PNP BJT Q1. A voltage VbeQ2 is a voltage drop across a base and an emitter of a PNP BJT Q2. A voltage dVbe is a voltage difference between voltage VbeQ1 and VbeQ2.

Compared with circuit 100, in circuit 400A, a voltage Vbg corresponds to voltage V1 and voltage VbeQ2 corresponds to voltage V2 in FIG. 1. By characteristics of transistors Q1 and Q2, a value of each of voltages VbeQ1 and VbeQ2 varies depending on a size of corresponding transistors Q1 and Q2. As a result, voltage dVbe varies depending on sizes of transistors Q1 and Q2. In some embodiments, the size of transistor Q1 is N times the size of transistor Q2. The size relationship between transistors Q1 and Q2 is referred to as a ratio N:1. Other size relationships between transistors Q1 and transistor Q2 are within the contemplated scope of the present disclosure. A current source 410 provides a current I41 to generate voltage Vbg. A current source 420 provides a current I42 for transistor Q2.

Compared with circuit 100 in FIG. 1, R42 corresponds to 2R, and d(Vo) or d(Vbg−VbeQ2) corresponds to d(V1−V2).

Based on equation (1):

$$d(Vo)=d(Vbg-VbeQ2)=dt/C \qquad (11)$$

Based on equation (11), a change in voltage Vo depends on a change in time dt and a capacitive value of capacitor C, without depending on the changes in temperature of resistor R42, of currents I41 or current I42, of VbeQ1 or of VbeQ2.

Figure 5B:
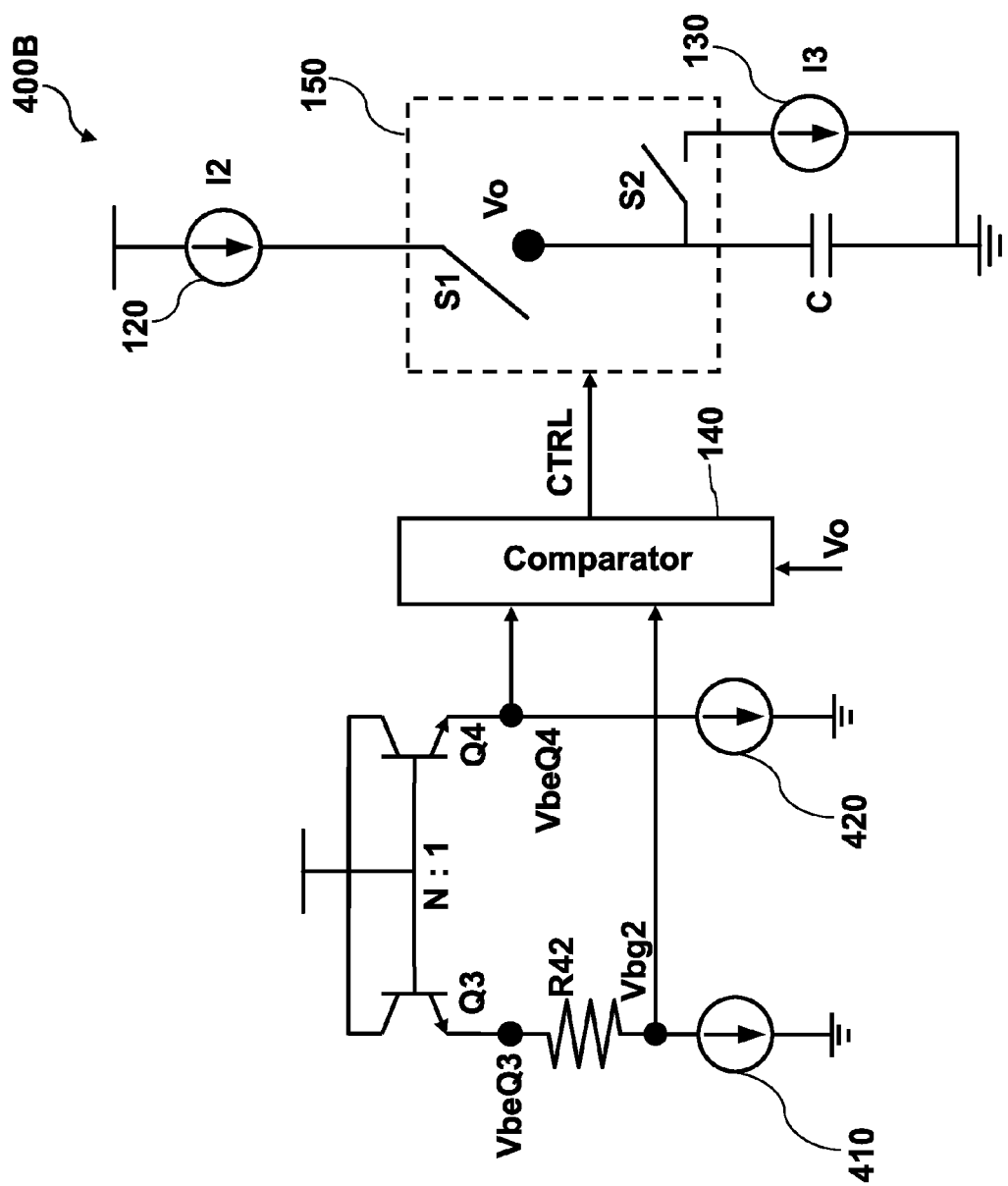

FIG. 5B is a diagram of a circuit 400B, in accordance with some embodiments. In some embodiments, circuit 400B is used in a temperature sensor in a manner similar to circuit 400A.

For illustration, a voltage drop across a base and an emitter of a transistor Q3 and a transistor Q4 is called VbeQ3 and VbeQ4, respectively. Compared with circuit 400A, in circuit 400B, NPN BJTs Q3 and Q4 replace PNP BJTs Q1 and Q2 in FIG. 4A, respectively. Voltage VbeQ4 corresponds to voltage VbeQ2. A voltage Vbg2 corresponds to voltage Vbg. A voltage difference between voltage VbeQ4 and Vbg2 is called dVbe2.

Based on equation (11):

$$d(Vo)=dVbe2=VbeQ4-Vbg2=dt/C \qquad (16)$$

Based on equation (16), a change in voltage Vo depends on a change in time dt and a capacitive value of capacitor C, without depending on the changes in temperature of resistor R42, of currents I41 or current I42, of VbeQ3 or of VbeQ4.

Figure 6A:
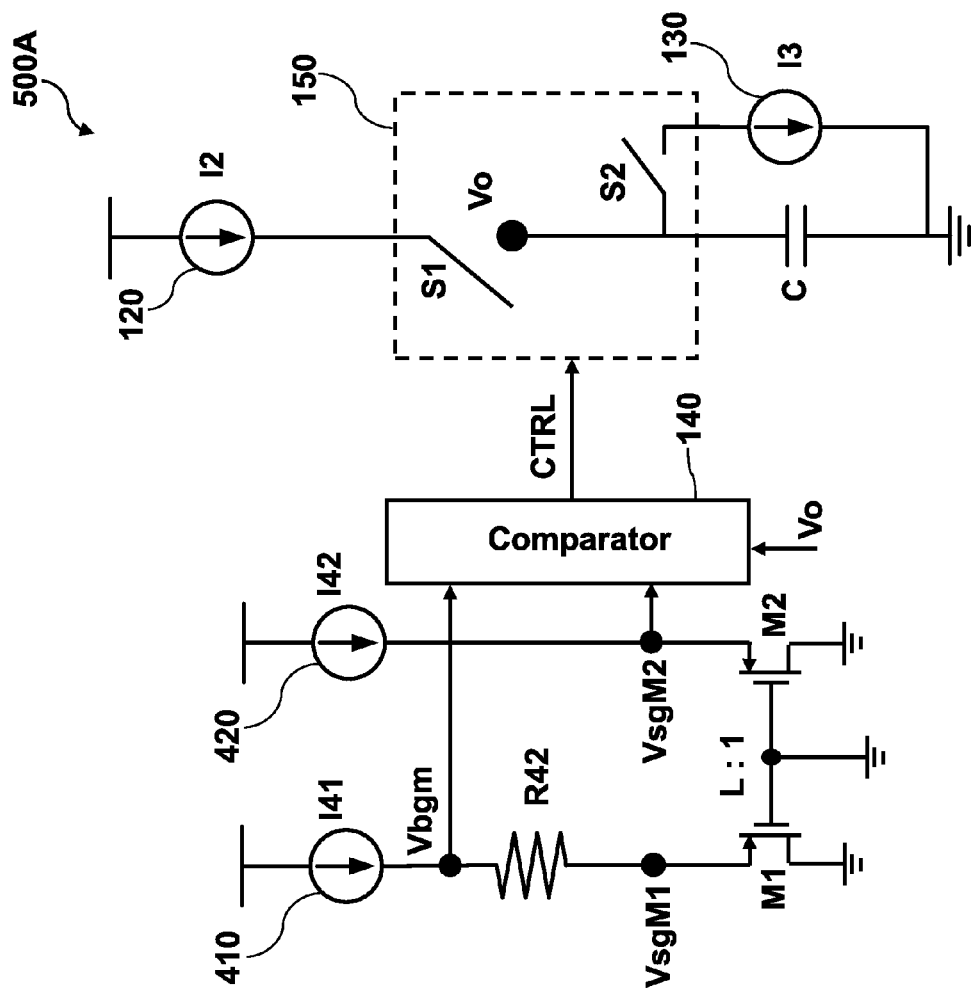

FIG. 6A is a diagram of a circuit 500A, in accordance with some embodiments. In some embodiments, circuit 500A is used in a temperature sensor in a manner similar to circuit 100.

For illustration, a voltage VsgM1 and a voltage VsgM2 are a voltage drop across a source and a gate of a PMOS transistor M1 and a PMOS transistor M2, respectively. Compared with circuit 400A, in circuit 500A, voltage VsgM2 corresponds to voltage VbeQ2 in FIG. 4A, and a voltage Vbgm corresponds to voltage Vbg.

A voltage dVsg is a voltage difference between voltages VsgM1 and VsgM2. By characteristics of transistors M1 and M2, a value of each of voltages VsgM1 and VsgM2 varies depending on a size of corresponding transistors M1 and M2. As a result, voltage dVsg varies depending on the sizes of transistors M1 and M2. In some embodiments, the size of transistor M1 is L times the size of transistor M2. The size relationship between transistors M1 and M2 is referred to as a ratio L:1.

Compared with circuit 400A in FIG. 4A, d(Vo) or d(Vbgm−Vsgm2) corresponds to d(Vbg−VbeQ2).

Based on equation (11):

$$d(Vo)=d(Vbgm-Vsgm2)=dt/C \qquad (21)$$

Based on equation (21), a change in voltage Vo depends on a change of time and a capacitive value of capacitor C, without depending on the changes in temperature of resistor R42, of currents I41 or current I42, or of Vsgm1 or Vsgm2.

Figure 6B:
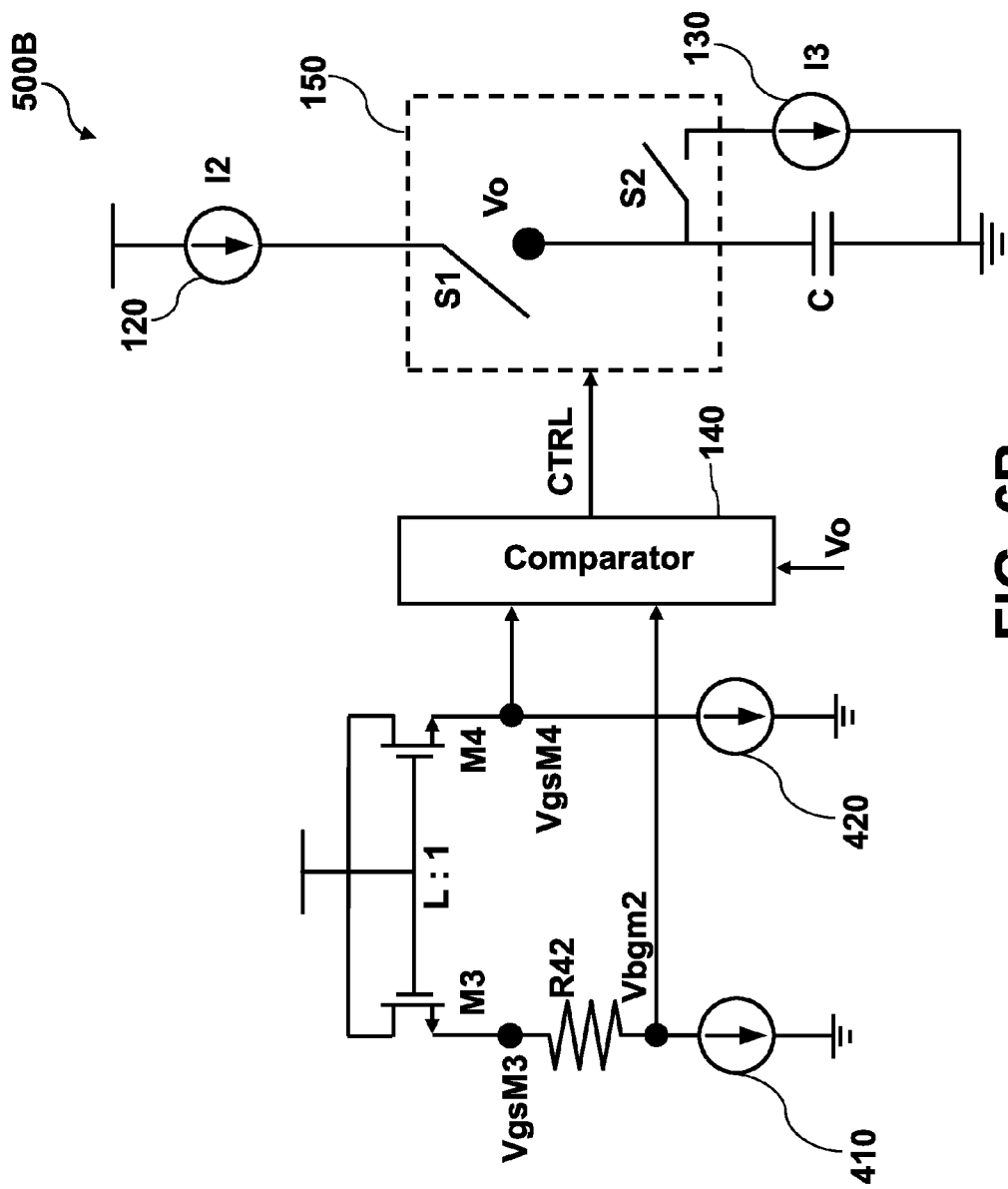

FIG. 6B is a diagram of a circuit 500B, in accordance with some embodiments. In some embodiments, circuit 500B is used in a temperature sensor in a manner similar to circuit 500A.

For illustration, a voltage drop across a gate and a source of a transistor M3 and a transistor M4 is called VgsM3 and VgsM4, respectively. Compared with circuit 500A, in circuit 500B, NMOS transistors M3 and M4 replace PMOS transistors M1 and M2 in FIG. 5A, respectively. Voltage VgsM4 corresponds to voltage Vbgm. A voltage Vbgm2 corresponds to voltage VgsM2. A voltage difference between voltage VgsM4 and Vbgm2 is called dVsg2.

Based on equation (11):

$$d(Vo)=dVsg2=VgsM4-Vbgm2=dt/C \qquad (26)$$

Based on equation (26), a change in voltage Vo depends on a change in time dt and a capacitive value of capacitor C, without depending on the changes in temperature of resistor R42, of currents I41 or current I42, of VgsM3 or of VgsM4.

Various embodiments related to circuit 100 are advantageous over other approaches that use MOS transistors. For example, the various embodiments are not subject to current variation that would otherwise be induced by current source mismatch in MOS transistors. The various embodiments do not have noise that would otherwise need to be canceled by a chop technique, for example, in other approaches. Further, in various embodiments of the present disclosure, a single resistor branch is used to generate voltages V1 and/or V2 to provide voltage Vo. Technique to obtain temperature in accordance with various embodiments of the present disclosure is therefore called resistive thermal sensing.

In some embodiments, circuit 100 is used in a planar or a FinFET semiconductor structure. In other words, techniques of the present disclosure are compatible with both the planar and FinFET processes. For example, in some embodiments, circuit 100 is built by a FinFET process. A current source, such as current source 110, is implemented by a transistor. Based on the FinFET technology, an impedance of the transistor used as current source 110 increases, compared with an impedance when the transistor is built by another technology. As a result, a gain-bandwidth of comparator 140 also increases. In some embodiments, circuits 400A, 400B, 500A, and/or 500B are fabricated using a FinFET process and thus have similar advantages as circuit 100.

As each layer of a semiconductor structure includes different types of resistors, techniques in various embodiments of the present disclosure are therefore are applicable to monitoring temperature variations in different layers and thus different depths of a semiconductor structure. Further, voltages V1 and V2 are generated in a same resistor branch 130. As a result, variation in temperature of one voltage is canceled by variation in temperature of another voltage. In contrast, in other approaches, two voltages comparable to voltages V1 and V2 are generated in two different branches. Current mismatch could occur in different branches in those approaches. As a result, in those approaches, variation in temperature of one voltage is not canceled by variation in temperature of the other voltage. Further, in other approaches that are BJT based, BJTs are formed in the substrate and not formed in other layers. As a result, sensing techniques in those approaches are applicable only in the substrate, but not in other layers of the semiconductor structure. In some embodiments, circuit 100 is usable to detect temperature variations at a layer within the substrate and/or multiple interconnection layers, which is also known as back end of line (BEOL) layers. In some embodiments, circuits 400A, 400B, 500A, and 500B are usable to detect temperature variations at a layer within the substrate.

As shown in FIG. 1, circuit 100 uses a single resistor branch. As a result, 1/f noise in operation VDD is canceled, circuitry and die area for a chop technique to cancel 1/f noise are avoided.

Further, various embodiments of the present disclosure are advantageous over other approaches that use BJT. For example, operation voltage VDD of the various embodiments is not limited by the forward-junction of the BJT. As a result, values of operation voltage VDD of the various embodiments are lower than 0.7 V. In contrast, in approaches that use BJT, operation voltage VDD of related circuits is limited by the forward-junction of the BJT, and cannot be lower than 0.7 V. In contrast, in some embodiments, circuits 100, 500A, and 500B do not have this forward junction bias limitation.

In some embodiments, time periods P of voltage Vo in FIG. 2 at different corresponding temperatures T are obtained to generate a relationship between time periods P and temperatures T. As a result, given a time period, such as time period Pi, a corresponding temperature Ti, for example, is determined based on the relationship.

Method

Figure 7:
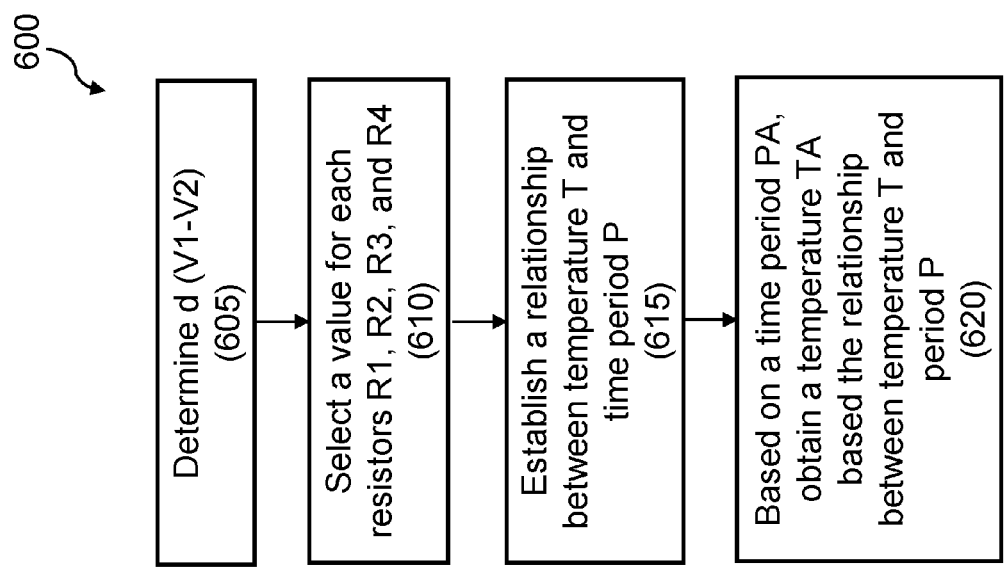
FIG. 7 is a flowchart of a method of operating the circuit in FIG. 1 in accordance with some embodiments.

FIG. 7 is a flowchart of a method 600, in accordance with some embodiments. Method 600 illustrates operation of circuit 100 in FIG. 1.

In operation 605, a voltage difference d(V1−V2) between voltages V1 and V2 is determined. In some embodiments, the voltage difference d(V1−V2) is expressed by ratio RAT. For example, ratio RAT with a predetermined number of 3 is selected. In other words, a value of voltage V1 is three times a value of voltage V2. Different relationships between voltages V1 and V2 are within the contemplated scope of the present disclosure.

In operation 610, a value of each of resistors R1, R2, R3, and R4 is determined to provide voltages V1 and V2 based on the difference d(V1−V2) and/or ratio RAT. For illustration, each of resistors R1, R2, R3, and R4 is selected to have an equal resistive value R to satisfy the illustrated ratio RAT to be 3.

In operation 615, a plurality of voltages Vo is obtained at a plurality of temperatures T. In other words, a plurality of data points for voltage Vo and temperature T is obtained. At a particular data point corresponding to a temperature T, voltage Vo behaves as explained by waveform 200 in FIG. 2. Voltage Vo also has a corresponding time period P. Based on the plurality of data points of temperature T and corresponding time period P, a relationship between temperature T and period P is established. For illustration, the relationship is called relationship REL. In some embodiments, establishing relationship REL based on a plurality data point is called a multi-point calibration. In contrast, if one data point corresponding to one temperature and one time period is used to determine relationship REL, obtaining relationship REL is called a one-point calibration.

In operation 620, when circuit 100 is used in a particular application, voltage Vo is obtained having an application period PA, for example. Based on application period PA and relationship REL, a corresponding temperature TA, for example, is obtained. In other words, temperature TA has been sensed. Alternatively, based on temperature TA and relationship REL, corresponding PA is obtained.

In some embodiments, circuit 100 operates at a known temperature, such as room temperature, which, for illustration, is 25° C. Circuit 100 thus provides a known time period P at 25° C. When temperature in the room changes, time period P changes. Based on the changed period P and relationship REL, the changed temperature in the room is determined or sensed. Explained in a different way, circuit 100 is used to monitor or sense the temperature change or temperature variation. In some embodiments, in a one point calibration system, sensing a temperature variation is obtained from the changed period P and a SPICE simulation.

FIG. 7 using circuit 100 is for illustration. With respect to circuit 400A in FIG. 5A, operations 615 and 620 are similar in which voltages Vbg and VbeQ2 replace corresponding voltages V1 and V2 in FIG. 1. Likewise, with respect to circuit 400B in FIG. 5B, operations 615 and 620 are similar in which voltages VbeQ4 and Vbg2 replace corresponding voltages V1 and V2. With respect to circuit 500A in FIG. 6A, operations 615 and 620 are similar in which voltages Vbgm and VsgM2 replace corresponding voltages V1 and V2. With respect to circuit 500B in FIG. 6B, operations 615 and 620 are similar in which voltages VgsM4 and VBgm2 replace corresponding voltages V1 and V2.

In some embodiments, a circuit includes a comparator unit, a capacitive device, and a switching network. The comparator unit is configured to set a control signal at a first logical value when an output voltage reaches a first voltage value from being less than the first voltage value, and to set the control signal at a second logical value when the output voltage reaches a second voltage value from being greater than the second voltage. The capacitive device provides the output voltage. The switching network is configured to charge or discharge the capacitive device based on the control signal.

In some embodiments, a circuit includes a voltage divider, a first switch, a capacitive device, a switching network, and a comparator unit. The voltage divider includes a first output node, a second output node, and a third output node. The first switch selectively couples the voltage divider with a voltage source or a first current source. The switching network is configured to charge or discharge the capacitive device, hereby generating an output voltage value of the capacitive device. The comparator unit includes a first input, a second input, and a third input. The first input is coupled to one of the first output node or the second output node of the voltage divider. The second input is coupled to the third output node of the voltage divider. The third input is configured to receive the output voltage value. The comparator unit is configured to cause the switching network to charge the capacitive device until the output voltage value reaches a first voltage value at the first input and to discharge the capacitive device until the output voltage value reaches a second voltage value at the second input.

In some embodiments, a method includes selectively couple a voltage source or a current source to the voltage divider by a switch. A first voltage value is generated at a first output node of a voltage divider. A second voltage value is generated at a second output node of the voltage divider. An output voltage of a capacitive device is charged until the output voltage reaches the first voltage value when the voltage source is coupled to the voltage divider. The output voltage of the capacitive device is discharged until the output voltage reaches the second voltage value.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

Various figures show discrete resistors and capacitors for illustration. Equivalent circuitry may be used. For example, a resistive device, circuitry or network (e.g., a combination of resistors, resistive devices, circuitry, etc.) can be used in place of a resistor. Similarly, a capacitive device, circuitry or network (e.g., a combination of capacitors, capacitive devices, circuitry, etc.) can be used in place of a capacitor.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
    a comparator unit configured to
        set a control signal at a first logical value when an output voltage reaches a first voltage value from being less than the first voltage value; and
        set the control signal at a second logical value when the output voltage reaches a second voltage value from being greater than the second voltage value;
    a capacitive device providing the output voltage;
    a switching network configured to charge or discharge the capacitive device based on the control signal;
    a voltage source;
    a current source; and
    at least one resistive device comprising a first node and a second node, a voltage value of the first node is provided to the comparator unit as the first voltage value when the voltage source is coupled to the at least one resistive device, and a voltage value of the second node is provided to the comparator unit as the first voltage value when the current source is coupled to the at least one resistive device.

2. The circuit of claim 1, wherein
    the at least one resistive device is coupled between the comparator unit and the voltage source or the current source.

3. The circuit of claim 2, wherein
    at least one resistive device of the at least one resistive device is formed in a layer of a semiconductor structure.

4. The circuit of claim 3, wherein
    the semiconductor structure is a FinFET.

5. The circuit of claim 1, further comprising:
    a first switch, wherein the at least one resistive device is coupled between the first switch and a reference node, the at least one resistive device is configured to provide the first voltage value and the second voltage value, and the first switch selectively couples the at least one resistive device to the voltage source or the current source.

6. The circuit of claim 5, wherein the at least one resistive device comprises a plurality of resistors connected in series, and the first voltage value is output from a node adjoining two corresponding resistors of the plurality of resistors.

7. The circuit of claim 5, wherein the at least one resistive device comprises:
    a plurality of resistors connected in series;
    each of the first node and the second node is a node adjoining two corresponding resistors of the plurality of resistors.

8. The circuit of claim 7, further comprising a second switch configured to electrically couple the comparator with the first node or the second node, thereby providing the first voltage value from the first node or the second node through the second switch.

9. The circuit of claim 8, wherein the first switch and the second switch are controlled based on a common signal.

10. A circuit comprising:
    a voltage divider, comprising a first output node, a second output node, and a third output node;
    a first switch configured to selectively couple the voltage divider with a voltage source or a first current source;
    a capacitive device;
    a switching network configured to charge or discharge the capacitive device, hereby generating an output voltage value of the capacitive device; and
    a comparator unit comprising:
        a first input coupled to the first output node of the voltage divider when the first switch couples the voltage divider with the voltage source or the second output node of the voltage divider when the first switch couples the voltage divider with the first current source,
        a second input coupled to the third output node of the voltage divider, and
        a third input configured to receive the output voltage value,
    the comparator unit being configured to cause the switching network to charge the capacitive device until the output voltage value reaches a first voltage value at the first input and to discharge the capacitive device until the output voltage value reaches a second voltage value at the second input.

11. The circuit of claim 10, further comprising:
    a second switch configured to selectively couple the first input of the comparator unit to the first output node or the second output node of the voltage divider.

12. The circuit of claim 11, wherein the first switch and the second switch are controlled based on a common signal.

13. The circuit of claim 10, further comprising:
    a second current source; and
    a third current source, wherein
    the switching network comprises:
        a second switch between the second current source and the capacitive device; and
        a third switch between the third current source and the capacitive device,
        the second switch is closed and the third switch is open when charging the capacitive device, and
        the second switch is open and the third switch is closed when discharging the capacitive device.

14. The circuit of claim 13, wherein
    a current value of the first current source, a current value of the second current source, and a current value of the third current source are substantially the same.

15. The circuit of claim 10, wherein
    a resistive device of the voltage divider is formed in a layer of a semiconductor structure.

16. The circuit of claim 10, wherein
    a resistive device of the voltage divider is formed in a layer of a FinFET semiconductor structure.

17. The circuit of claim 10, wherein the voltage divider comprises a plurality of resistors connected in series, each of the first output node and the second output node is a node adjoining two corresponding resistors of the plurality of resistors.

18. A method comprising:
    selectively coupling a voltage source or a current source to a voltage divider by a first switch;

generating a first voltage value at a first output node of the voltage divider;

generating a second voltage value at a second output node of the voltage divider;

generating a third voltage value at a third output node of the voltage divider;

charging an output voltage of a capacitive device until the output voltage reaches the first voltage value by coupling the first output node to a comparator when the voltage source is coupled to the voltage divider;

charging the output voltage of the capacitive device until the output voltage reaches the second voltage value by coupling the second output node to the comparator when the current source is coupled to the voltage divider; and discharging the output voltage of the capacitive device until the output voltage reaches the third voltage value.

19. The method of claim 18, further comprising:

determining a voltage difference between the first voltage value and the third voltage value based on a time period of the output voltage.

20. The method of claim 18, further comprising:

selectively coupling the first output node or the second output node to the comparator by a second switch, wherein the first switch and the second switch are controlled based on a common signal.

* * * * *